(12) United States Patent
Matsumaru

(10) Patent No.: US 10,254,537 B2
(45) Date of Patent: Apr. 9, 2019

(54) OPTICAL DEVICE AND METHOD OF PRODUCING SAME

(71) Applicant: FUJIKURA LTD., Tokyo (JP)

(72) Inventor: Kohei Matsumaru, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/546,190

(22) PCT Filed: Oct. 25, 2016

(86) PCT No.: PCT/JP2016/081615
§ 371 (c)(1),
(2) Date: Jul. 25, 2017

(87) PCT Pub. No.: WO2017/122413
PCT Pub. Date: Jul. 20, 2017

(65) Prior Publication Data
US 2018/0003957 A1    Jan. 4, 2018

(30) Foreign Application Priority Data
Jan. 14, 2016   (JP) ................................ 2016-005454

(51) Int. Cl.
*G02B 7/18* (2006.01)
*G02B 27/00* (2006.01)
*G02F 1/1333* (2006.01)
*H01L 27/146* (2006.01)

(52) U.S. Cl.
CPC ... *G02B 27/0006* (2013.01); *G02F 1/133308* (2013.01); *H01L 27/14618* (2013.01); *G02F 2001/133331* (2013.01)

(58) Field of Classification Search
CPC ... G02B 27/0006; G02B 27/00; G02F 1/1333; G02F 1/133308; G02F 1/133331

USPC .......................................................... 359/513
See application file for complete search history.

(56) References Cited

U.S. PATENT DOCUMENTS

| 2004/0150740 A1* | 8/2004 | Hsin .................... H04N 5/2253 348/340 |
| 2011/0267535 A1* | 11/2011 | Seo ................... H01L 27/14618 348/374 |
| 2012/0300153 A1* | 11/2012 | Fujii ................. G02F 1/133308 349/58 |

FOREIGN PATENT DOCUMENTS

| CN | 102377950 A | 3/2012 |
| JP | H06-151629 A | 5/1994 |
| JP | H09-148469 A | 6/1997 |
| JP | 2000-277648 A | 10/2000 |

(Continued)

OTHER PUBLICATIONS

Office Action in counterpart Chinese Patent Appplication No. 201680006754.5 dated Nov. 23, 2018 (6 pages).

*Primary Examiner* — Euncha P Cherry
(74) *Attorney, Agent, or Firm* — Osha Liang LLP

(57) ABSTRACT

An optical device including a housing; an optical element contained in the housing; and a cover that seals an opening of the housing. The cover includes a frame member having an opening that serves as a window section, and a window section glass plate bonded to the frame member and seals the opening of the frame member. The frame member has a thickness which is greater than that of the window section glass plate, an upper surface of the frame member protrudes past an upper surface of the window section glass plate, a lower surface of the frame member protrudes past a lower surface of the window section glass plate.

7 Claims, 7 Drawing Sheets

(56) References Cited

FOREIGN PATENT DOCUMENTS

| | | |
|---|---|---|
| JP | 2001-68691 A | 3/2001 |
| JP | 2003-217163 A | 7/2003 |
| JP | 2005-347337 A | 12/2005 |
| JP | 2008-130178 A | 6/2008 |
| JP | 2011-008105 A | 1/2011 |
| KR | 100673643 B1 | 1/2007 |

* cited by examiner

WELDING →

OPTICAL DEVICE AND METHOD OF PRODUCING SAME

TECHNICAL FIELD

One or more embodiments of the present invention relate to (i) an optical device in which a housing containing an optical element is sealed by use of a cover having an optical window and (ii) a method of producing the optical device.

BACKGROUND

In known techniques, an optical device, constituted by a hermetic sealing package including a hermetically sealed optical element, is used to suppress the effects of, for example, humidity on the optical element.

For example, Patent Literature 1 discloses a configuration in which an optical element is contained in a ceramic package, and the ceramic package is sealed by use of a metal cover after the ceramic package has been filled with inert gas. The cover has an opening in a central portion thereof, and the opening is sealed by a plate-shaped transparent window made from sapphire. The transparent window is bonded, on either the top or the bottom of the cover, to a portion of the cover along the opening.

Patent Literature 2 discloses an optical window package in which plate-shaped optical glass is provided on an upper side of a package so as to seal the interior of the package, a metal sealing being between the package and the optical glass. The optical glass has an opening in a central portion thereof, and this opening is formed by a pattern of metal deposited to a back side of the optical glass in a region excluding a region of the opening. With this configuration, the optical glass functions as a cover of the package.

CITATION LIST

Patent Literature

[Patent Literature 1]
Japanese Patent Application Publication Tokukai No. 2011-8105 (Publication date: Jan. 13, 2011)
[Patent Literature 2]
Japanese Patent Application Publication Tokukaihei No. 9-148469 (Publication date: Jun. 6, 1997)

In the above conventional configurations, the cover of the package includes a glass plate having an optical window, and an upper surface or lower surface of the glass plate protrudes so as to be a top surface or a bottom surface of the cover. As such, during production etc. of the cover, the glass plate can easily come into contact with (i) other members or (ii) a jig or the like used during production, and consequently sustain mechanical damage.

Specifically, as illustrated in FIGS. 12A and 12B, in a configuration where a cover 101 is configured so as to include a glass plate 111 on top of or beneath a metal frame 112, an upper surface or lower surface of the glass plate 111 protrudes so as to be a top surface or a bottom surface of the cover 101. Note that reference number 113 is a sealing solder layer for bonding the glass plate 111 to the metal frame 112. With this configuration, in a case where, for example, work is being carried out on a stage 121, the glass plate 111 can easily come into contact with a jig or other members of the stage 121 or the like. This makes it easy for the glass plate 111 to sustain mechanical damage and have defects such as cracking or chipping. In particular, in a case where mechanical processing such as dicing is used to cut the glass plate into a predetermined size, corners of the glass plate which have not undergone chamfering or the like after cutting will have a low mechanical strength in comparison to a surface of the glass plate. As such, even a small impact can easily cause cracking.

Furthermore, even in a case where a crack is minute and does not affect mechanical strength at the time the crack occurs, there is still the risk that, for example, stress applied during a subsequent production step will cause the minute crack to increase in size such that the crack exceeds a tolerance. Examples of stress applied during production include (i) stress occurring during bonding of the glass plate to the metal frame by use of solder, which stress arises from a difference in respective thermal expansion coefficients of the metal frame and the glass plate, and (ii) stress occurring during seam welding of the metal frame to a housing, which stress arises from a difference in respective temperatures of the metal frame and the glass plate.

Still further, even in a case where a defect occurring in the glass plate due to contact with another member does not affect mechanical strength, the defect can affect optical qualities of the glass plate. In particular, in an optical device such as an optical switch element, transmittance of an optical window has a great effect on the characteristics of the optical device, and thus there are strict optical demands placed on the glass plate. As such, it is important to manage production steps so as to prevent defects from occurring in a surface of the glass plate. Any defect, in a surface of the glass plate, whose dimensions exceed certain dimensions will cause scattering of incident light and outputted light, therefore causing a malfunction with regards to the output of the optical device.

SUMMARY

One or more embodiments of the present invention may provide (i) an optical device whose glass plate, which forms an optical window, is unlikely to sustain mechanical damage and therefore allows for prevention of defects, and (ii) a method of producing such an optical device.

An optical device in accordance with an aspect of the present invention may include: a housing; an optical element contained in the housing; and a cover which seals an opening of the housing, the cover including: a frame member having an opening which opening serves as a window section, and a window section glass plate bonded to the frame member so as to seal the opening of the frame member, the frame member having a thickness which is greater than that of the window section glass plate, an upper surface of the frame member protruding past an upper surface of the window section glass plate, a lower surface of the frame member protruding past a lower surface of the window section glass plate.

Advantageous Effects

A configuration of an aspect of the present invention may render a window section glass plate of a cover less likely to sustain mechanical damage, thereby making it possible to prevent defects in the window section glass plate.

DESCRIPTION OF EMBODIMENTS

Embodiment 1

Figure 1:
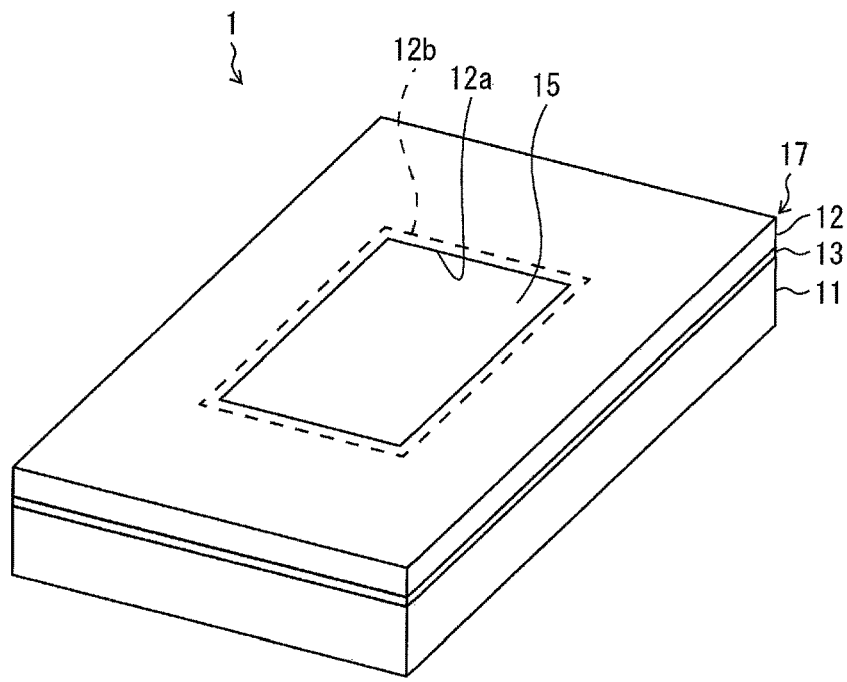
FIG. 1 is a perspective view schematically illustrating an optical device in accordance with Embodiment 1 of the present invention.
Figure 2:
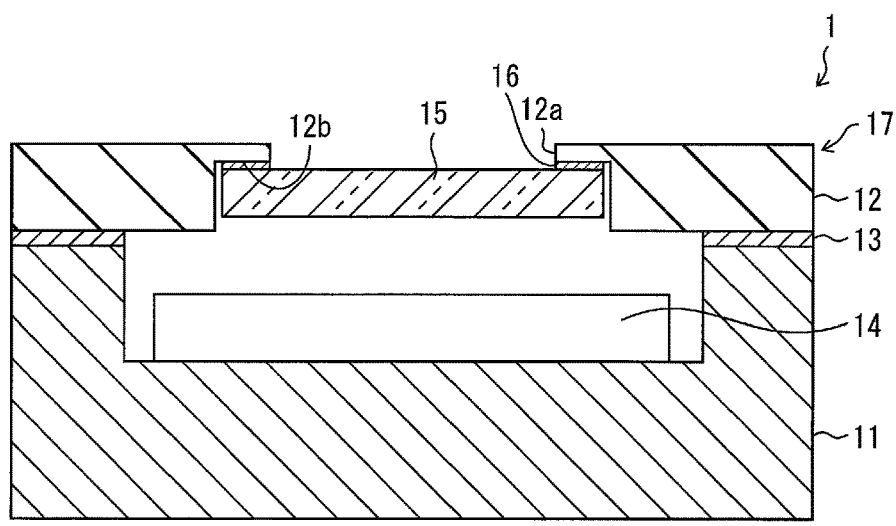
FIG. 2 is a vertical cross-sectional view of the optical device of FIG. 1.

The following description will discuss Embodiment 1 of the present invention with reference to the drawings. FIG. 1 is a perspective view schematically illustrating an optical device 1 in accordance with Embodiment 1. FIG. 2 is a vertical cross-sectional view of the optical device 1 of FIG. 1. Note that the optical device 1 of Embodiment 1 is, for example, a hermetically sealed LCOS package which includes an LCOS (Liquid Crystal On Silicon) element as an optical element 14.

(Configuration of Optical Device 1)

As illustrated in FIGS. 1 and 2, the optical device 1 includes a housing 11 in the form of a rectangular container. A metal frame (frame member) 12 is provided on the housing 11. The housing 11 and the metal frame 12 are fixed to each other via a sealing metal layer 13 provided between (i) an upper edge of the housing 11 and (ii) a lower surface of the metal frame 12. An optical element 14 is provided to a central portion of a floor of the housing 11.

The metal frame 12 has, in a central portion thereof, an opening 12a which serves as a transparent window. A window section glass plate 15 provided to the metal frame 12 seals this opening 12a. The window section glass plate 15 is fixed to the window section glass plate 15 by a sealing solder layer 16. The window section glass plate 15 has a thickness which is less than that of the metal frame 12. An upper surface and a lower surface of the window section glass plate 15 are recessed with respect to an upper surface and a lower surface, respectively, of the metal frame 12, so as not to protrude beyond the upper surface or the lower surface of the metal frame 12. In other words, the upper surface and the lower surface of the metal frame 12 protrude past the upper surface and the lower surface, respectively, of the window section glass plate 15.

In one specific example, the metal frame 12 has a thickness of 1.6 mm, and the window section glass plate 15 has a thickness of 1 mm. In this example, ignoring the thickness of the sealing solder layer 16, the upper surface and the lower surface of the metal frame 12 each protrude 0.3 mm past the upper surface and the lower surface, respectively, of the window section glass plate 15.

In order to provide the window section glass plate 15 and the metal frame 12 in the above manner, a seat section 12b is formed in the metal frame 12, in a region surrounding the opening 12a. The seat section 12b is recessed from the lower surface of the metal frame 12 toward the upper surface of the metal frame 12. The window section glass plate 15 is provided in the seat section 12b. The window section glass plate 15 is fixed to the metal frame 12 via the sealing solder layer 16, which is provided between a lower surface of the seat section 12b and the upper surface of the window section glass plate 15. A portion of the optical device 1 which portion includes (i) the metal frame 12 and (ii) the window section glass plate 15 constitutes a cover 17 for the housing 11.

Examples of the material of the housing 11 encompass alumina oxide and alumina nitride. Examples of the material of the metal frame 12 encompass (i) Kovar (Registered Trademark), which is an alloy in which nickel are cobalt are mixed into iron, and (ii) an alloy containing (a) nickel and (b) iron. At and around normal temperature, Kovar (Registered Trademark) has a thermal expansion coefficient which is low among metals. Characteristics of Kovar (Registered Trademark) are similar to those of hard glass. Examples of the material of the sealing metal layer 13 encompass a silver brazing sealing material. Examples of the optical element 14 encompass a liquid crystal driving element. Examples of the material of the window section glass plate 15 encompass Kovar (Registered Trademark) glass. Examples of the material of the sealing solder layer 16 encompass an alloy containing (i) gold and The optical device 1 is sealed as described above, and the interior thereof has a certain concentration of helium.

(Method of Producing Optical Device 1, Advantages of Optical Device 1)

In the above configuration, the optical element 14 is provided in the housing 11 during production of the optical device 1. For example, the optical element 14 is connected, via wire bonding, to electrodes provided to the floor of the housing 11.

Next, the cover 17, which includes the metal frame 12 and the window section glass plate 15, is provided on the housing 11 and is seam welded thereto via the sealing metal layer 13.

Figure 3A:
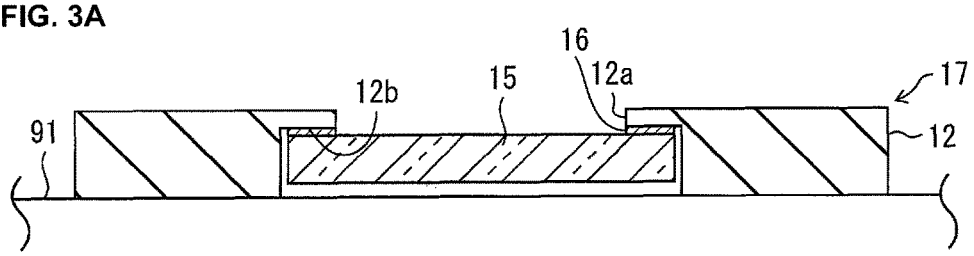
FIG. 3A is a vertical cross-sectional view of a cover placed on a working stage such that an opening of a metal frame of FIG. 2 is on an upper side.
Figure 3B:
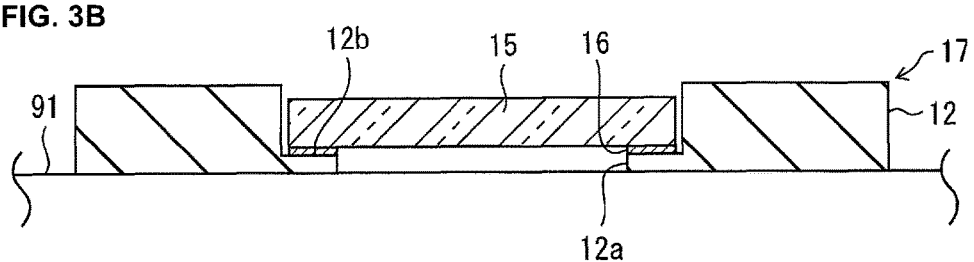
FIG. 3B is a vertical cross-sectional view of the cover placed on the working stage such that the opening of the metal frame is on a lower side.

During production of the optical device 1, the cover 17 is placed on a working stage 91 as illustrated in FIGS. 3A and 3B and processed as necessary thereupon. FIG. 3A is a vertical cross-sectional view of the cover 17 having been placed on the working stage 91 such that the opening 12a of the metal frame 12 is on an upper side. FIG. 3B is a vertical cross-sectional view of the cover 17 having been placed on the working stage 91 such that the opening 12a is on a lower side.

Regardless of whether the cover 17 is placed on the working stage 91 such that the opening 12a is on an upper side (as in FIG. 3A) or on a lower side (as in FIG. 3B), the upper surface and the lower surface of the window section glass plate 15 are recessed with respect to the upper surface and the lower surface, respectively, of the metal frame 12.

As such, the window section glass plate 15, and particularly a surface of the window section glass plate 15, does not come into contact with any foreign object or jig on the working stage 91, and does not sustain mechanical damage that would be caused by such contact. This makes it possible to prevent, in the window section glass plate 15, defects such as (i) linear or punctate surficial defects, (ii) internal cracking, and (iii) chipping that can occur on the corners of the window section glass plate 15. Note that in the following descriptions, defects including cracking, chipping, and the like are collectively referred to by use of the term "defect."

Since the above configuration prevents defects in the window section glass plate 15, it also enables a reduction in costs. Furthermore, preventing mechanical damage of the window section glass plate 15 makes it possible to increase the long-term reliability of the optical device 1.

Still further, since the window section glass plate 15 is fixed to the seat section 12b, the window section glass plate 15 can be easily and stably mounted to the metal frame 12.

Note that although in Embodiment 1, the window section glass plate 15 is mounted to the seat section 12b formed in the metal frame 12, this example is non-limiting. For example, the window section glass plate 15 can be fixed to the metal frame 12 in a configuration where, instead of the recessed seat section 12b being formed in the metal frame 12, the opening 12a is formed to have a size corresponding to that of the window section glass plate 15, and the upper surface and lower surface of the metal frame 12 protrude past the upper surface and the lower surface, respectively, of the window section glass plate 15.

Embodiment 2

Figure 4:
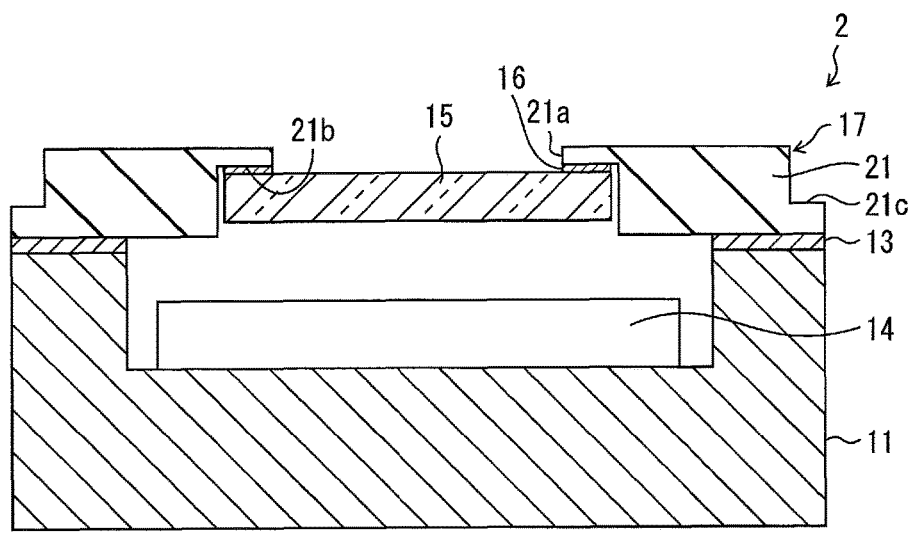
FIG. 4 is a vertical cross-sectional view of an optical device in accordance with Embodiment 2 of the present invention.

The following description will discuss Embodiment 2 of the present invention with reference to the drawings. Note that, for convenience, members having functions identical to those of the respective members of the foregoing embodiment are given respective identical reference numerals, and a description of those members is omitted. FIG. 4 is a vertical cross-sectional view of an optical device 2 of Embodiment 2.

(Configuration of Optical Device 2)

As illustrated in FIG. 4, the optical device 2 includes a metal frame (frame member) 21 instead of the metal frame 12 illustrated in FIG. 2.

In the metal frame 21, a portion of the metal frame 21 along the entire outer perimeter thereof, which portion is bonded to the housing 11, is a thin section 21c having a thin thickness. The metal frame 21 is otherwise configurationally similar to the metal frame 12. The metal frame 21 has an opening 21a and a seat section 21b which correspond to the opening 12a and the seat section 12b, respectively, of the metal frame 12.

(Advantages of Optical Device 2)

In the above configuration, the optical device 2 includes the metal frame 21 which has the thin section 21c. The thin section 21c makes it easy to seam weld the metal frame 21 to the housing 11 with a small amount of electrical power. Other advantages of the optical device 2 are the same as those of the optical device 1.

Embodiment 3

Figure 5:
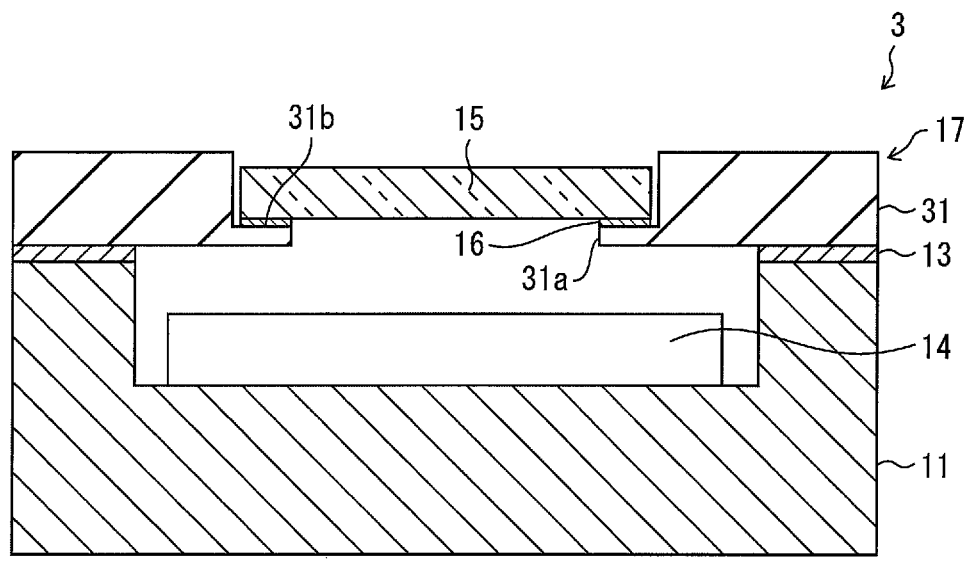
FIG. 5 is a vertical cross-sectional view of an optical device in accordance with Embodiment 3 of the present invention.

The following description will discuss another embodiment of the present invention with reference to the drawings. Note that, for convenience, members having functions identical to those of the respective members of the foregoing embodiment are given respective identical reference numerals, and a description of those members is omitted. FIG. 5 is a vertical cross-sectional view of an optical device 3 in accordance with an embodiment of the present invention.

(Configuration of Optical Device 3)

As illustrated in FIG. 5, the optical device 2 includes a metal frame (frame member) 31 instead of the metal frame 12 illustrated in FIG. 2.

In contrast to the metal frame 12, the metal frame 31 includes a seat section 31b, which is recessed from an upper surface of the metal frame 31 toward a lower surface of the metal frame 31. In a case where the window section glass plate 15 is fixed to the seat section 31b, the upper surface and the lower surface of the window section glass plate 15 are recessed with respect to the upper surface and the lower surface, respectively, of the metal frame 31, so as not to protrude past the upper surface and the lower surface of the metal frame 31. This is a point of similarity with the metal frame 12, i.e., with the optical device 1. The metal frame 31 is otherwise configurationally similar to the metal frame 12. The metal frame 31 has an opening 31a which corresponds to the opening 12a of the metal frame 12.

(Advantages of Optical Device 3)

In the above configuration, the optical device 3 differs from the optical device 1 only in that the seat section 31b of the metal frame 31 is provided in a position that is vertically reversed compared to that of the seat section 12b of the metal frame 12. As such, the advantages of the optical device 3 are similar to those of the optical device 1.

Embodiment 4

Figure 6:
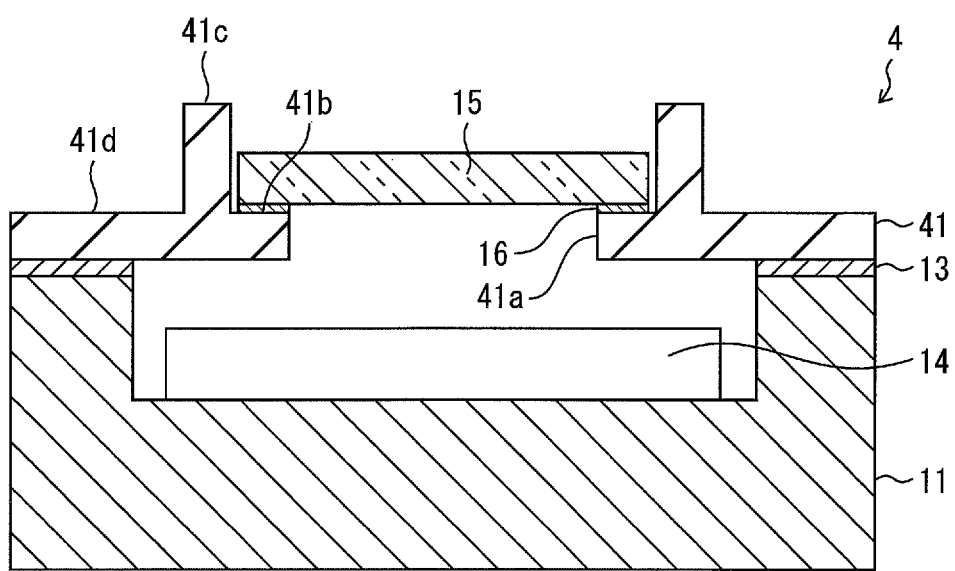
FIG. 6 is a vertical cross-sectional view of an optical device in accordance with Embodiment 4 of the present invention.

The following description will discuss Embodiment 4 of the present invention with reference to the drawings. Note that, for convenience, members having functions identical to those of the respective members of the foregoing embodiment are given respective identical reference numerals, and a description of those members is omitted. FIG. 6 is a vertical cross-sectional view of an optical device 4 in accordance with Embodiment 4.

(Configuration of Optical Device 4)

As illustrated in FIG. 6, the optical device 4 includes a metal frame (frame member) 41 instead of the metal frame 12 illustrated in FIG. 2.

The metal frame 41 has a seat section 41b which corresponds to the seat section 12b of the metal frame 12. A portion of the metal frame 41 which portion surrounds the seat section 41b is a thick section, similarly to the configuration of the metal frame 12. A region of the metal frame 41 which is outward from the thick section is a thin section. In other words, the portion of the metal frame 41 which portion surrounds the seat section 41b is a glass-protecting wall section 41c, and a portion of the metal frame 41 which portion excludes (i) the seat section 41b and (ii) the glass-protecting wall section 41c is a thin section 41d.

The glass-protecting wall section 41c has a height so as to be higher than the upper surface of the window section glass plate 15 provided to the seat section 41b. The thin section 41d has a height so as to be lower than the glass-protecting wall section 41c. The height of the thin section 41d is, for example, approximately equal to that of the seat section 41b. The optical device 4 is otherwise configurationally similar to the optical device 3, i.e., to the optical device 1.

(Advantages of Optical Device 4)

With the above configuration, the upper surface of the window section glass plate 15 is recessed with respect to the upper surface of the metal frame 41, i.e., with respect to a top surface of the glass-protecting wall section 41c, and the lower surface of the window section glass plate 15 is recessed with respect to the lower surface of the metal frame 41. In other words, the upper surface and the lower surface of the metal frame 41 protrude past the upper surface and the lower surface, respectively, of the window section glass plate 15.

As such, with the optical device 4, similarly to the optical device 1, the window section glass plate 15, and particularly a surface of the window section glass plate 15, does not come into contact with any foreign object or jig on the working stage 91, and does not sustain mechanical damage that would be caused by such contact.

Furthermore, excepting the glass-protecting wall section 41c, the metal frame 41 is constituted by the seat section 41b and the thin section 41d, which are both thin. This reduces the weight of the metal frame 41.

In the optical device 4, an outer peripheral portion of the metal frame 41 is the thin section 41d. As such, as with the configuration of the optical device 2, the thin section 41d makes it easy to seam weld the metal frame 41 to the housing 11 with a small amount of electrical power.

Still further, a portion of the metal frame which portion excludes the glass-protecting wall section 41c has a reduced thickness which facilitates the dispersion of stress, which stress occurs when the metal frame 41 is welded to the housing 11. This reduces stress applied to the window section glass plate 15. Other advantages of the optical device 4 are the same as those of the optical device 1.

(Explanation of Dispersion of Stress Occurring from Seam Welding)

The following description will use the optical device 2 as illustrated in FIG. 4 to discuss dispersion of stress, specifically stress occurring from seam welding.

Figure 7A:
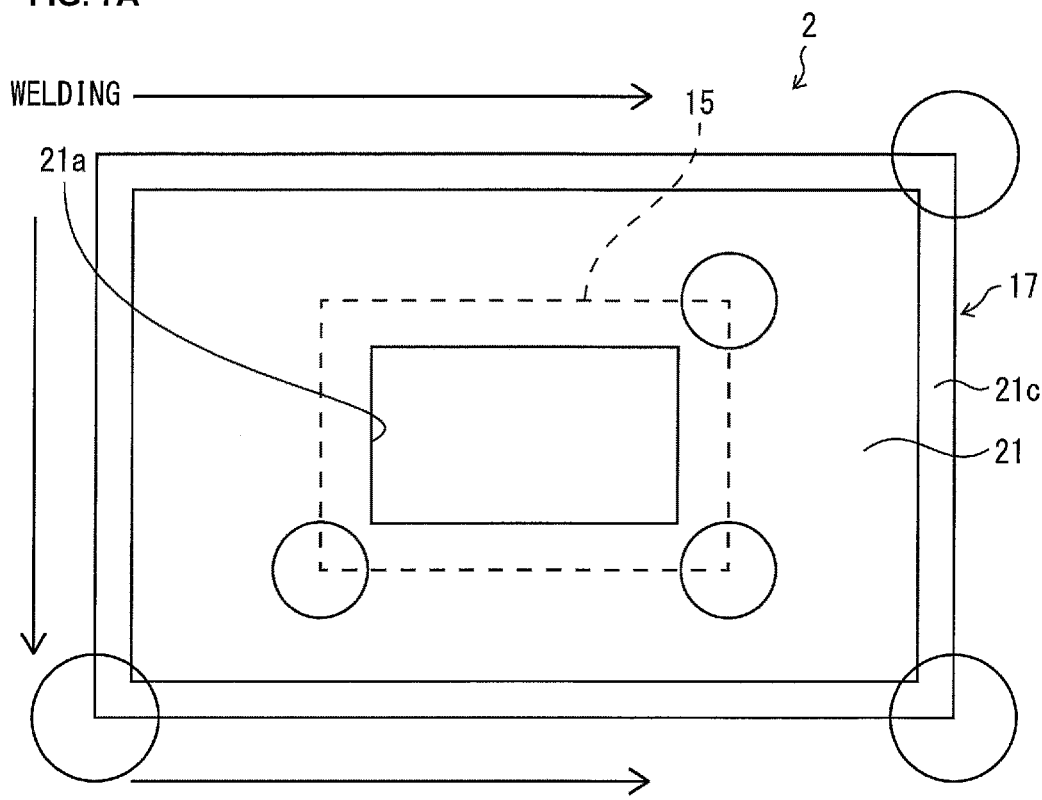
FIG. 7A is plan view for explaining seam welding of a metal frame of the optical device of FIG. 4 to a housing.
Figure 7B:
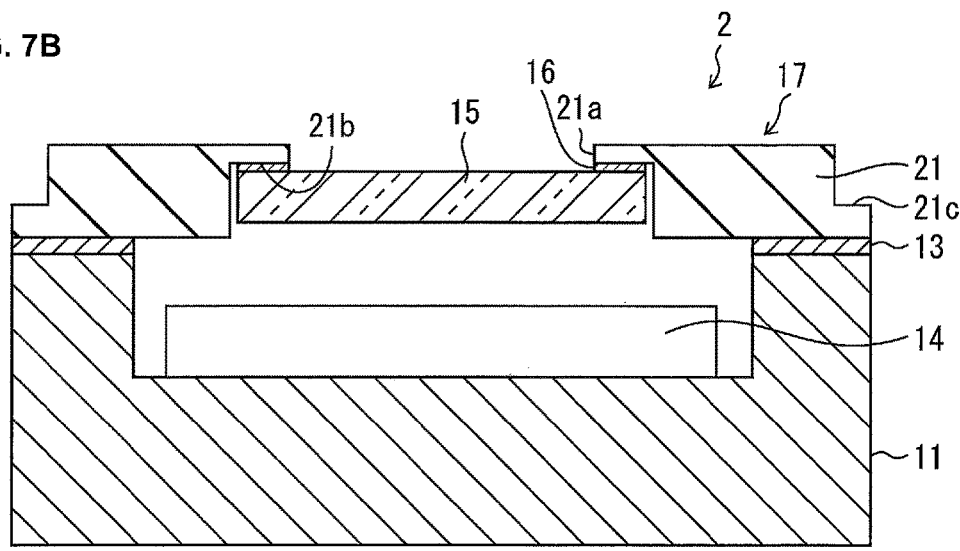
FIG. 7B is a vertical cross-sectional view of the optical device illustrated in FIG. 7A.

FIG. 7A is a plan view for explaining seam welding of (i) the metal frame 21 of the optical device 2 of FIG. 4 to (ii) the housing 11. FIG. 7B is a vertical cross-sectional view of the optical device 2 illustrated in FIG. 7A.

As illustrated in FIGS. 7A and 7B, seam welding progresses from a corner of the metal frame 21 to other corners thereof (indicated by circles in FIG. 7A). As such, fractures are likely to occur in the window section glass plate 15 at positions (also indicated by circles in FIG. 7A) which correspond to those corners of the metal frame 21 where welding ends. This is presumably caused by a mechanism in which, as welding progresses, there is an increase in portions which are fixed by welding as well as a decrease in places for stress to be released. This causes stress to become concentrated in a final place of release (a corner).

Propagation of stress in seam welding is presumably affected by the structural continuity of the metal frame and thermal conduction. As such, a metal frame having the structure of the metal frame 21, or of the metal frame 41 (see FIG. 6), has a non-uniform width (a structure with a recessed part and a protruding part) and therefore avoids stress being concentrated at a single point. Such a structure presumably makes it easy for stress to be evenly distributed (easy for stress to disperse) and thus makes it difficult for the window section glass plate 15 to become damaged.

(Relation Between Glass-Protecting Wall Section 41c of Metal Frame 41 and Incident Light Entering Optical Device 4)

Figure 8:
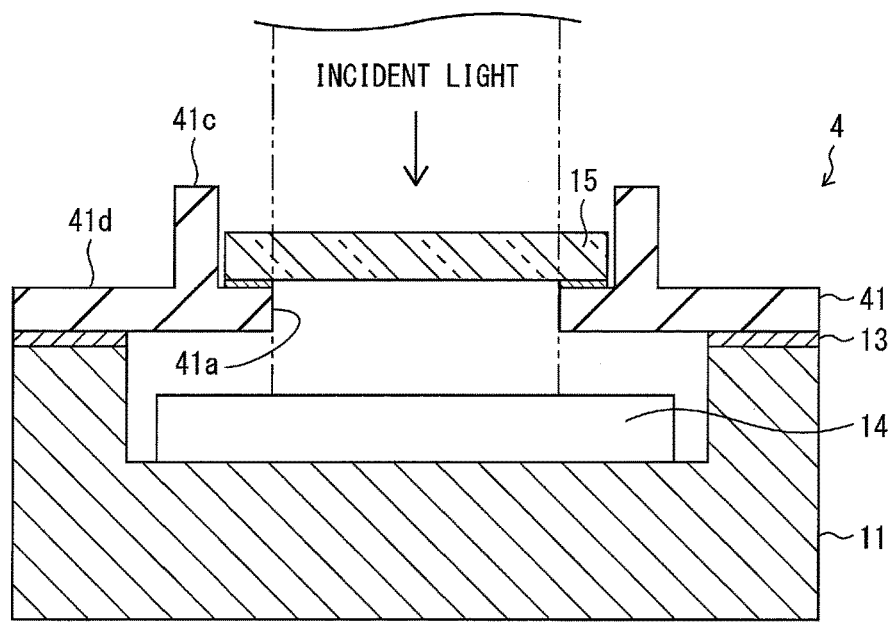
FIG. 8 is a diagram illustrating incident light entering the optical device illustrated in FIG. 6.
Figure 9:
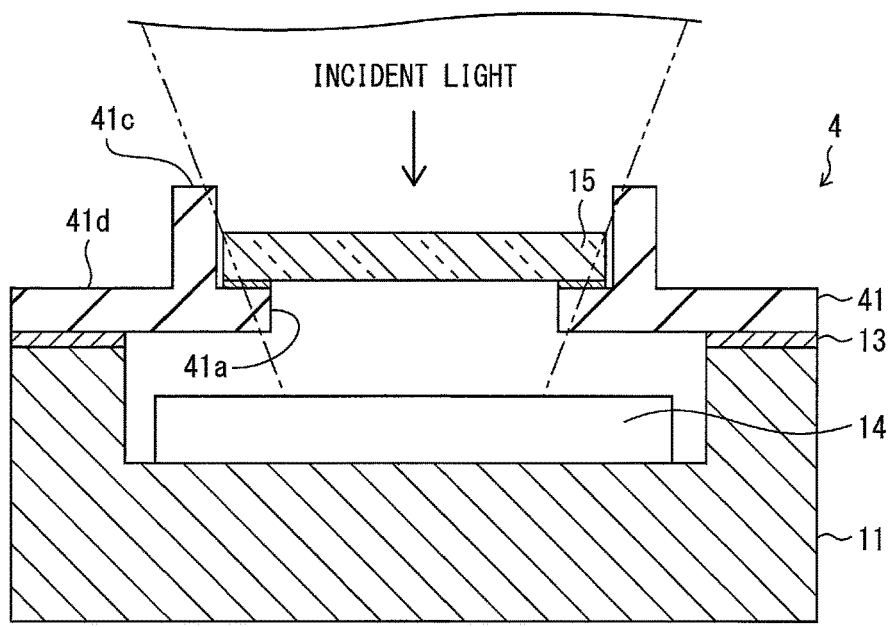
FIG. 9 is a diagram illustrating case where, in the optical device of FIG. 6, a glass-protecting wall section of a metal frame blocks the entrance of incident light into an optical device.

FIG. 8 is a diagram illustrating incident light entering the optical device 4. FIG. 9 is a diagram illustrating a case where, in the optical device 4, the glass-protecting wall section 41c of the metal frame 41 blocks the entrance of incident light into the optical device 4.

In the optical device 4, the metal frame 41 includes the glass-protecting wall section 41c which protrudes upward. As such, in considering the angle at which incident light enters the optical device 4, this configuration may present concerns with regards to design limitations on the metal frame 41, such as limitations on the height of the glass-protecting wall section 41c.

However, as illustrated in FIG. 8, with the optical device 4, the angle at which incident light enters the optical device 4 is adjusted, by use of a mirror or the like, so as to be orthogonal to the optical element 14. That is, with the optical device 4, light will not be diagonally incident on the optical element 14, and thus the glass-protecting wall section 41c will not block the incident light in a manner as illustrated in FIG. 9. As such, from the standpoint of the angle at which incident light enters the optical element 14, there are no design limitations, such as limitations on the height to which the glass-protecting wall section 41c protrudes.

In the above descriptions of the optical device 4, the metal frame 41 was described as having (i) the glass-protecting wall section 41c which protrudes upward, and (ii) the seat section 41b and the thin section 41d which are recessed downward with respect to the glass-protecting wall section 41c. Note however, that an opposite configuration is possible, i.e., a configuration where (i) the glass-protecting wall section 41c protrudes downward, and (ii) the seat section 41b and the thin section 41d are recessed upward with respect to the glass-protecting wall section 41c. The same applies to optical devices 5 and 6 which are discussed below.

Embodiment 4 describes the metal frame 41 as being a single member obtained by integrally forming the glass-protecting wall section 41c and the thin section 41d. Note, however, that the thin section 41d and the glass-protecting wall section 41c can be separately formed and then bonded together to form the metal frame 41. In such a case, the metal frame 41 has a thickness which is the sum of (i) the thickness of the thin section 41d and (ii) the thickness (height) of the glass-protecting wall section 41c. That is, the metal frame 41 can be formed by bonding together a plurality of members. The same applies to the respective metal frames of other embodiments.

Embodiment 5

Figure 10:
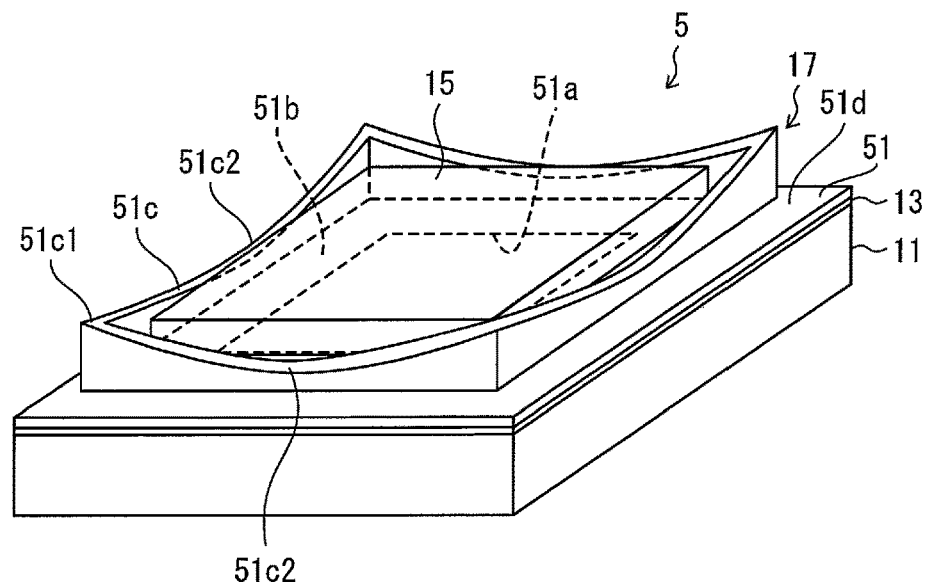
FIG. 10 is a perspective view illustrating an optical device in accordance with Embodiment 5 of the present invention.

The following description will discuss Embodiment 5 of the present invention with reference to the drawings. Note that, for convenience, members having functions identical to those of the respective members of the foregoing embodiment are given respective identical reference numerals, and a description of those members is omitted. FIG. 10 is a perspective view illustrating an optical device 5 in accordance with Embodiment 5.

(Configuration of Optical Device 5)

As illustrated in FIG. 10, the optical device 5 includes a metal frame (frame member) 51 instead of the metal frame 41 of the optical device 4 illustrated in FIG. 6. The optical device 5 is otherwise configurationally similar to the optical device 4.

The metal frame 51 includes an opening 51a, a seat section 51b, a glass-protecting wall section 51c, and a thin section 51d, which correspond to the opening 41a, the seat section 41b, the glass-protecting wall section 41c, and the thin section 41d, respectively, of the metal frame 41. However, in contrast to the glass-protecting wall section 41c, the glass-protecting wall section 51c is configured such that, for example, the four corners thereof are each a maximum height section 51c1 at which the glass-protecting wall section 51c has a maximum height, and areas between two of the maximum height sections 51c1 are each a minimum height section 51c2 at which the glass-protecting wall section 51c has a minimum height. That is, the glass-protecting wall section 51c has a height that differs along a perimetric direction of the glass-protecting wall section 51c.

The maximum height sections 51c1 of the glass-protecting wall section 51c each have a height so as to be higher than the upper surface of the window section glass plate 15. The minimum height sections 51c2 each have a height so as to be, for example, lower than the upper surface of the window section glass plate 15.

(Advantages of Optical Device 5)

With the above configuration, the optical device 5 is configured such that the glass-protecting wall section 51c of the metal frame 51 has maximum height sections 51c1 and minimum height sections 51c2. As such, in comparison to a configuration such as that of the metal frame 41 of optical device 4, in which the glass-protecting wall section 51c has a uniform height, the optical device 5 makes it possible to more favorably disperse stress occurring from seam welding the thin section 51d of the metal frame 51 to the housing 11. This makes it even more difficult for the window section glass plate 15 to become damaged from the above-described concentration of stress. Other advantages of the optical device 5 are the same as those of the optical device 4.

Embodiment 6

Figure 11:
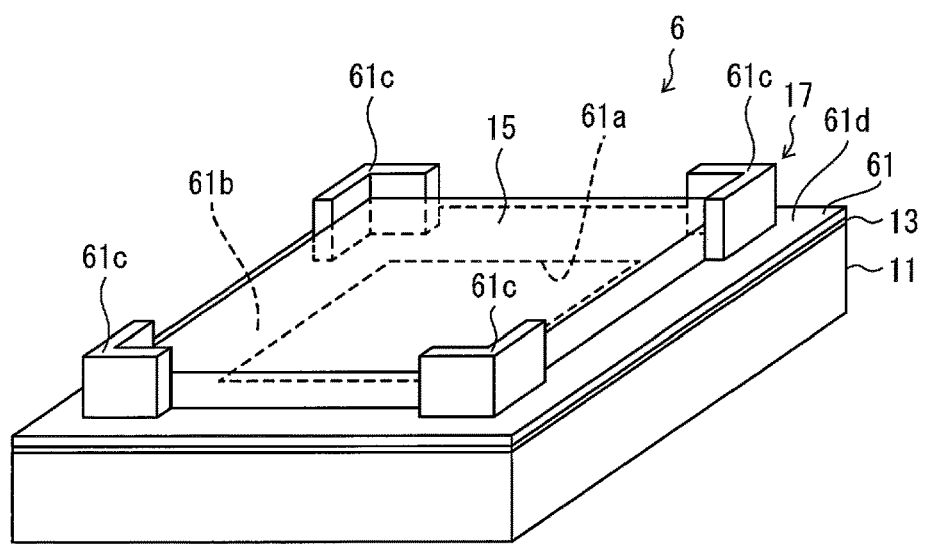
FIG. 11 is a perspective view illustrating an optical device in accordance with Embodiment 6 of the present invention.
Figure 12A:
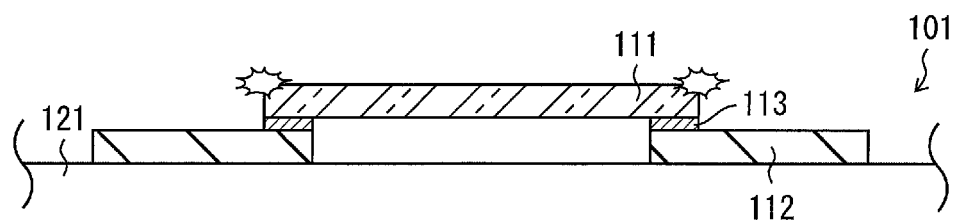
FIG. 12A is a diagram illustrating a case where, in a cover where a glass plate is provided above a metal frame, an upper surface of the glass plate is the top surface of the cover.
Figure 12B:
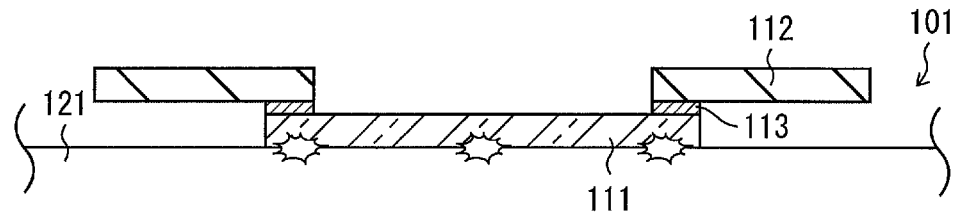
FIG. 12B is a diagram illustrating a case where, in a cover where a glass plate is provided beneath a metal frame, a lower surface of the glass plate is the bottom surface of the cover.

The following description will discuss Embodiment 6 of the present invention with reference to the drawings. Note that, for convenience, members having functions identical to those of the respective members of the foregoing embodiment are given respective identical reference numerals, and a description of those members is omitted. FIG. 11 is a perspective view illustrating an optical device 6 in accordance with Embodiment 6.

(Configuration of Optical Device 6)

As illustrated in FIG. 11, the optical device 6 includes a metal frame (frame member) 61 instead of the metal frame 41 of the optical device 4 illustrated in FIG. 6. The optical device 6 is otherwise configurationally similar to the optical device 4.

The metal frame 61 includes an opening 61a, a seat section 61b, a glass-protecting wall section 61c, and a thin section 61d which correspond to the opening 41a, the seat section 41b, the glass-protecting wall section 41c and the thin section 41d, respectively, of the metal frame 41. However, in contrast to the glass-protecting wall section 41c, the glass-protecting wall section 61c is configured such that, for example, only four corners are provided, and areas between portions of the glass-protecting wall section 61c are constituted by the thin section 61d. In other words, the glass-protecting wall section 61c of metal frame 61 is provided discontinuously around the seat section 61b. Similarly to the glass-protecting wall section 41c, the glass-protecting wall section 61c has a height so as to be higher than the upper surface of the window section glass plate 15.

Note that the glass-protecting wall section 61c is not limited to having a right-angled shape as illustrated in FIG. 11. The glass-protecting wall section 61c need only be configured so as to protrude from the thin section 61d and past the upper surface of the window section glass plate 15. For example, the glass-protecting wall section 61c can be configured in the form of cylindrical pins. Furthermore, positions in which the glass-protecting wall section 61c is formed are not limited to the corners of the window section glass plate 15. For example, the glass-protecting wall section 61c can be formed at positions partway along each side connecting the corners of the window section glass plate 15. Still further, the number of portions of the glass-protecting wall section 61c is not limited to four.

(Advantages of Optical Device 6)

With the above configuration, the optical device 6 is configured such that the glass-protecting wall section 61c of the metal frame 61 is provided at, for example, only the four corners of the window section glass plate 15. As such, compared to a configuration such as that of the metal frame 41 of optical device 4, in which the glass-protecting wall section 61c has a uniform height, the optical device 6 makes it possible to more favorably disperse stress occurring from seam welding the thin section 61d of the metal frame 61 to the housing 11. This makes it even more difficult for the window section glass plate 15 to become damaged from the above-described concentration of stress. Other advantages of the optical device 5 are the same as those of the optical device 4.

An optical device in accordance with one or more embodiments of the present invention may include: a housing; an optical element contained in the housing; and a cover which seals an opening of the housing, the cover including: a frame member having an opening which opening serves as a window section, and a window section glass plate bonded to the frame member so as to seal the opening of the frame member, the frame member having a thickness which is greater than that of the window section glass plate, an upper surface of the frame member protruding past an upper surface of the window section glass plate, a lower surface of the frame member protruding past a lower surface of the window section glass plate.

With the above configuration, the frame member is thicker than the window section glass plate, and the upper surface and the lower surface of the frame member protrude past the upper surface and the lower surface, respectively, of the window section glass plate. This makes it difficult for the window section glass plate of the cover to come into contact with other members such as a jig in a case where, for example, work is done on the cover, upon a stage, during a production step of the optical device. As such, with the above configuration, the window section glass plate of the cover is unlikely to sustain mechanical damage. This makes it possible to prevent defects in the window section glass plate.

The above optical device can be configured such that: a seat surface is formed around the opening of the frame member, the seat section being recessed from one surface of the frame member toward another surface of the frame member; and the window section glass plate is fixed to the seat section.

With the above configuration, the window section glass plate is fixed to the seat section, which is (i) formed around the opening of the frame member and (ii) recessed from one surface of the frame member toward another surface of the frame member. This makes it possible to easily and stably mount the window section glass plate to the frame member.

The above optical device can be configured such that a peripheral portion of the frame member, which peripheral portion is bonded to the housing, is a thin section.

With the above configuration, the frame member includes a thin section in a peripheral portion thereof, which thin section is bonded to the housing. This makes it possible to, for example, easily seam weld the frame member to the housing with a small amount of electrical power.

The above optical device can be configured such that a portion the frame member, which portion surrounds the seat section, is a glass-protecting wall section, at least a portion of the glass-protecting wall section being a maximum thickness section which is a thickest portion of the frame member, a portion of the frame member which portion excludes (i) the seat section and (ii) the glass-protecting wall section being a thin section which has a thickness that is less than that of the maximum thickness section.

The above configuration makes it possible to, for example, easily seam weld the thin section of the frame member to the housing with a small amount of electrical power.

Furthermore, a portion of the frame member which portion excludes (i) the seat section and (ii) the glass-protecting wall section is a thin section which has a thickness that is less than that of the maximum thickness section of the glass-protecting wall section. In addition to reducing the weight of the optical device, this configuration facilitates the dispersion of stress occurring when bonding the frame member to the housing via welding. This makes it possible to reduce stress applied to the window section glass plate.

The above optical device can be configured such that the glass-protecting wall section of the frame member has a height which differs along a perimetric direction of the glass-protecting wall section.

With the above configuration, the glass-protecting wall section of the frame member has a height which differs along the perimeter of the glass-protecting wall section. This further facilitates the distribution of stress which stress occurs when the frame member is bonded to the housing by, for example, seam welding. As such, it is possible to further reduce stress applied to the window section glass plate.

The above optical device can be configured such that the glass-protecting wall section of the frame member is provided discontinuously around the seat section.

The above configuration further facilitates the dispersion of stress which stress occurs when bonding the frame member to the housing via welding. This makes it possible to further reduce stress applied to the window section glass plate.

A method of producing an optical device in accordance with an aspect of the present invention includes the steps of: (a) sealing an opening of a frame member, which opening serves as a window section, by use of a window section glass plate; and (b) sealing an opening of a housing, which housing contains an optical element, by use of a cover, the frame member having a thickness which is greater than that of the window section glass plate, the window section glass plate being used to seal the opening of the frame member in the step (a) in a manner such that (i) an upper surface of the frame member protrudes past an upper surface of the window section glass plate and (ii) a lower surface of the frame member protrudes past a lower surface of the window section glass plate.

The above configuration brings about advantageous effects similar to those of the above optical device.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 Optical device
11 Housing
12 Metal frame (frame member)
12a Opening
12b Seat section
13 Sealing metal layer
14 Optical element
15 Window section glass plate
16 Sealing solder layer
17 Cover
2 Optical device
21 Metal frame (frame member)
21a Opening
21b Seat section
21c Thin section
3 Optical device
31 Metal frame (frame member)
31a Opening
31b Seat section
4 Optical device
41 Metal frame (frame member)
41a Opening
41b Seat section
41c Glass-protecting wall section
41d Thin section
5 Optical device
51 Metal frame (frame member)
51a Opening
51b Seat section
51c Glass-protecting wall section
51d Thin section
6 Optical device
61 Metal frame (frame member)
61a Opening
61b Seat section
61c Glass-protecting wall section
61d Thin section
91 Working stage

The invention claimed is:

1. An optical device comprising:
a housing;
an optical element contained in the housing; and
a cover that seals an opening of the housing, the cover comprising:
   a metal frame member comprising an opening that serves as a window section, and
   a window section glass plate bonded to the frame member and that seals the opening of the frame member, wherein
the housing is in a container form,
the cover is provided on the housing and fixed to the housing,
the frame member has a thickness which is greater than that of the window section glass plate, an upper surface of the frame member protrudes past an upper surface of the window section glass plate, and a lower surface of the frame member protrudes past a lower surface of the window section glass plate.

2. The optical device as set forth in claim 1, wherein:

a seat surface is formed around the opening of the frame member, the seat section is recessed from one surface of the frame member toward another surface of the frame member, and the window section glass plate is fixed to the seat section.

3. The optical device as set forth in claim 1, wherein a peripheral portion of the frame member is bonded to the housing and is a thin section.

4. The optical device as set forth in claim 2, wherein a portion of the frame member surrounds the seat section and is a glass-protecting wall section, at least a portion of the glass-protecting wall section is a maximum thickness section which is a thickest portion of the frame member, a portion of the frame member excludes (i) the seat section and (ii) the glass-protecting wall section, and the glass-protecting wall section is a thin section having a thickness that is less than that of the maximum thickness section.

5. The optical device as set forth in claim 4, wherein the glass-protecting wall section of the frame member has a height which differs along a perimetric direction of the glass-protecting wall section.

6. The optical device as set forth in claim 4, wherein the glass-protecting wall section of the frame member is provided discontinuously around the seat section.

7. A method of producing an optical device, the method comprising:

(a) sealing an opening of a metal frame member by use of a window section glass plate, wherein the opening serves as a window section; and (b) sealing an opening of a housing that contains an optical element by use of a cover, wherein the housing is in a container form, the cover is provided on the housing and fixed to the housing in step (b), the frame member has a thickness which is greater than that of the window section glass plate, the window section glass plate seals the opening of the frame member in the step (a) in a manner such that (i) an upper surface of the frame member protrudes past an upper surface of the window section glass plate and (ii) a lower surface of the frame member protrudes past a lower surface of the window section glass plate.

* * * * *